(12) United States Patent
Pal et al.

(10) Patent No.: US 8,084,828 B2
(45) Date of Patent: Dec. 27, 2011

(54) METHODS FOR PROTECTING GATE STACKS DURING FABRICATION OF SEMICONDUCTOR DEVICES AND SEMICONDUCTOR DEVICES FABRICATED FROM SUCH METHODS

(75) Inventors: Rohit Pal, Fishkill, NY (US); Man Fai Ng, Poughkeepsie, NY (US); David Brown, Pleasant Valley, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/815,129

(22) Filed: Jun. 14, 2010

(65) Prior Publication Data
US 2010/0244156 A1 Sep. 30, 2010

Related U.S. Application Data

(62) Division of application No. 12/330,292, filed on Dec. 8, 2008, now Pat. No. 7,763,508.

(60) Provisional application No. 61/111,632, filed on Nov. 5, 2008.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............ 257/369; 257/412; 257/E27.06
(58) Field of Classification Search ............ 257/369, 257/388, 412, E27.06, E27.062
See application file for complete search history.

(56) References Cited

U.S. PATENT DOCUMENTS

| 5,102,815 | A  | * | 4/1992 | Sanchez ............ 438/305 |
| 6,037,630 | A  | * | 3/2000 | Igarashi et al. ...... 257/336 |
| 7,524,716 | B2 |   | 4/2009 | Ting et al. |
| 2010/0099229 | A1 | * | 4/2010 | Chiu et al. .......... 438/238 |

* cited by examiner

*Primary Examiner* — Hoai V Pham
(74) *Attorney, Agent, or Firm* — Ingrassia Fisher & Lorenz, P.C.

(57) ABSTRACT

Methods for protecting gate stacks during fabrication of semiconductor devices and semiconductor devices fabricated from such methods are provided. In an embodiment, a method for fabricating a semiconductor device comprises forming a gate stack comprising a first gate stack-forming layer overlying a semiconductor substrate and forming first sidewall spacers about sidewalls of the gate stack. After the step of forming the first sidewall spacers, a portion of the first gate stack-forming layer is exposed. The exposed portion is anisotropically etched using the gate stack and the first sidewall spacers as an etch mask. Second sidewall spacers are formed adjacent the first sidewall spacers after the step of anisotropically etching.

16 Claims, 4 Drawing Sheets

METHODS FOR PROTECTING GATE STACKS DURING FABRICATION OF SEMICONDUCTOR DEVICES AND SEMICONDUCTOR DEVICES FABRICATED FROM SUCH METHODS

CROSS-REFERENCE TO RELATED APPLICATIONS

This is a division of application Ser. No. 12/330,292, filed Dec. 8, 2008, now U.S. Pat. No. 7,763,508, which claims the benefit of U.S. Provisional Application No. 61/111,632, filed Nov. 5, 2008.

FIELD OF THE INVENTION

The present invention generally relates to methods for fabricating semiconductor devices and semiconductors fabricated from such methods, and more particularly relates to methods for protecting gate stacks during fabrication of semiconductor devices and semiconductor devices fabricated from such methods.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). An MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions. There is a continuing trend to incorporate more and more circuitry on a single IC chip. To incorporate the increasing amount of circuitry, the size of each individual device in the circuit and the size and spacing between device elements (the feature size) must decrease.

To achieve scaling of semiconductor devices, a variety of unconventional, sensitive, and/or "exotic" materials are being contemplated. High dielectric constant materials, also referred to as "high-k dielectrics," such as hafnium dioxide ($HfO_2$), hafnium silicon oxynitride (HfSiON), or zirconium dioxide ($ZrO_2$), are considered for the 45 nm node technology and beyond to allow scaling of gate insulators. To prevent Fermi-level pinning, metal gates (MG) with the proper work function are used as gate electrodes on the high-k gate dielectrics. Such metal gate electrodes typically are formed of a metal gate-forming material such as lanthanum (La), aluminum (Al), magnesium (Mg), ruthenium (Ru), titanium-based materials such as titanium (Ti) and titanium nitride (TiN), tantalum-based materials such as tantalum (Ta) and tantalum nitride (TaN) or tantalum carbide ($Ta_2C$), or the like.

Typically during fabrication of a semiconductor device, the gate stack, comprising a gate insulator and a gate electrode, is exposed to liquid chemistries, such as solvents and/or aqueous solutions, used to remove disposable materials. For example, sulfur peroxide is commonly used during photolithography to strip photoresist from semiconductor substrates, ammonium peroxide is commonly used to clean materials of a semiconductor device, and hydrofluoric acid is commonly used as a pre-clean for metal silicide and to remove low temperature and other oxides. To protect the gate stack, particularly a gate stack comprising sensitive materials such as high-k dielectrics and metal gate-forming materials, a silicon nitride spacer is formed about sidewalls of the gate stack. However, depending on non-uniformities of the gate stack fabrication process or non-uniformities created during preparation of the semiconductor substrate prior to fabrication of the gate stacks, the silicon nitride spacer may not be adequate to protect the gate stack. For example, FIG. 1 is a cross-sectional view of gate stacks 10 overlying a semiconductor substrate 12. Each of the gate stacks comprises a first gate stack-forming layer 14. The first gate stack-forming layer 14 may comprise a high-k dielectric, a metal gate-forming material, or a combination thereof. The gate stacks 10 further comprise a second gate stack-forming layer, such as, for example, another metal gate-forming material or polycrystalline or amorphous silicon. Prior to fabrication of the gate stacks 10, shallow trench isolation (STI) regions 18 are formed within the semiconductor substrate 12 to electrically isolate other regions of the semiconductor substrate. Typically, the STI regions are fabricated by forming a patterned hard mask, usually silicon nitride, over the semiconductor substrate 12, etching exposed regions of the substrate to form trenches, and depositing an insulating material such as silicon oxide in the trenches. The silicon oxide is subjected to planarization to expose the hard mask and the hard mask then is removed by exposure to a wet etch chemistry, such as a subsequent phosphoric acid and hydrofluoric acid glaze. During exposure to the wet etch chemistry, the silicon oxide also is slightly etched laterally. This etching causes a "divot" or void 20 to be formed at the edge of the STI region 18 and the semiconductor substrate 12. Accordingly, during fabrication of the gate stacks 10, the first gate stack-forming layer 14 can be formed, not only overlying semiconductor substrate 12, but also in the divots 20.

In efforts to protect the gate stacks 10 from subsequent wet etch chemistries, a silicon nitride spacer 22 typically is formed about sidewalls of the gate stack. However, while the silicon nitride spacers protect the sidewalls of the gate stacks 10, portions 24 of the first gate stack-forming layer in the divots can still be exposed. During subsequent processing, when exposed to one or more wet etch chemistries that can etch the high-k dielectric, the metal gate-forming material, or both, such as, for example, sulfur peroxide, aluminum peroxide, or hydrofluoric acid, the exposed portions 24 of the gate stack-forming layer 14 in the divots are etched and provide a pathway for the etchant to attack the gate stack-forming layer 14 underlying the second gate stack-forming layer 16, as illustrated in FIG. 2. This etching can create a void 26 underlying the second gate stack-forming layer 16 of the gate stacks 10 and thus lead to catastrophic failure of subsequently-formed transistors comprising such void-containing gate stacks.

This phenomenon also may arise in other situations when divots are not created in the semiconductor substrate. FIG. 3 is a cross-sectional view of a gate stack 10 of a semiconductor device having "footings" 30 of first gate stack-forming layer 14. Footings can result from the non-uniformity of reactive ion etching processes, the non-uniformity of photolithography processes used to form the gate stacks, and the like. Footings also can result when first gate stack-forming layer 14 is deposited in scratches that are formed during polishing of the semiconductor substrate. These footings are exposed even though a protective spacer 22 may be disposed adjacent sidewalls of the gate stack 10. In this regard, the footings provide a pathway for wet etch chemistries used in subsequent processing to attack the first gate stack-forming layer 14 underlying the second gate stack-forming layer 16 of the gate stacks 10, thus forming voids (not shown) that result in catastrophic failure of a subsequently-formed transistor.

Accordingly, it is desirable to provide methods for fabricating semiconductor devices, which methods protect gate stacks comprising high-k dielectrics and/or metal gate-forming materials during subsequent wet etch processing. In addition, it is desirable to provide semiconductor devices fabricated from such methods. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for protecting gate stacks during fabrication of semiconductor devices and semiconductor devices fabricated from such methods are provided. In accordance with one exemplary embodiment of the present invention, a method for fabricating a semiconductor device comprises forming a gate stack comprising a first gate stack-forming layer overlying a semiconductor substrate and forming first sidewall spacers about sidewalls of the gate stack. After the step of forming the first sidewall spacers, a portion of the first gate stack-forming layer is exposed. The exposed portion is anisotropically etched using the gate stack and the first sidewall spacers as an etch mask. Second sidewall spacers are formed adjacent the first sidewall spacers after the step of anisotropically etching.

In accordance with another exemplary embodiment of the present invention, a method for fabricating a semiconductor device comprises forming a first gate stack-forming layer overlying a semiconductor substrate and forming a second gate stack-forming layer overlying the first gate stack-forming layer. The first gate stack-forming layer and the second gate stack-forming layer are etched to form a gate stack. After the step of etching, a first portion of the first gate stack-forming layer underlies the second gate stack-forming layer and a second portion of the first gate stack-forming layer has an exposed surface. A first sidewall spacer is formed about sidewalls of the second gate stack-forming layer. The second portion of the first gate stack-forming layer is anisotropically etched using the gate stack and the first sidewall spacer as an etch mask. A second sidewall spacer is formed adjacent the first sidewall spacer and the exposed surface of the second portion of the first gate stack-forming layer.

In accordance with a further exemplary embodiment of the present invention, a semiconductor transistor device comprises a semiconductor substrate and a gate stack overlying the semiconductor substrate. The gate stack comprises a first gate stack-forming layer and a second gate stack-forming layer. A first sidewall spacer contacts the second gate stack-forming layer and a second sidewall spacer contacts the first sidewall spacer and the first gate stack-forming layer.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 4-9 illustrate, in cross section, methods for protecting gate stacks of MOS transistors, particularly gate stacks comprising high-k dielectrics and/or metal gate-forming material, during subsequent wet etch processing used to form a semiconductor device 100. The various embodiments of the methods utilize two spacers disposed adjacent sidewalls of the high-k dielectrics and/or metal gate-forming material of the gate stacks. After formation of the first spacer but before formation of the second spacer, a directional etch is used to minimize the exposed high-k dielectric and/or the metal gate-forming material so that such material is substantially completely encapsulated by the spacers. In this regard, wet etch chemistries used during subsequent processing do not have a path through which to attack the high-k dielectric and/or the metal gate-forming material of the gate stack itself.

Various steps in the manufacture of MOS components are well known and so, in the interest of brevity, many conventional steps will only be mentioned briefly herein or will be omitted entirely without providing the well known process details. As used herein, the term "MOS transistor" properly refers to a device having a gate electrode formed of a metal-comprising material and an oxide gate insulator, although it is understood that the term may also be used to refer to any semiconductor device that includes a conductive gate electrode (whether metal or other conductive material) that is positioned over a gate insulator (whether oxide or other insulator) which, in turn, is positioned over a semiconductor substrate.

Figure 1:
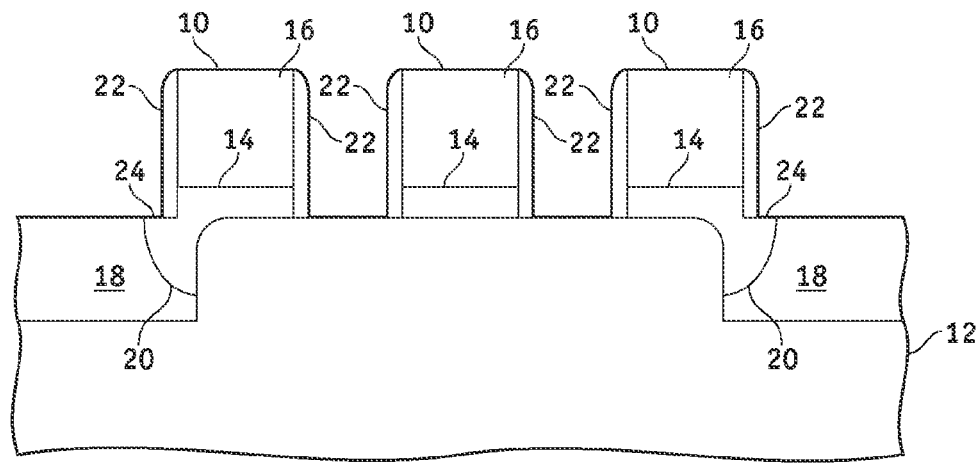
FIG. 1 is a schematic, cross-sectional view of conventional gate stacks comprised of a first gate stack-forming layer and an overlying second gate stack-forming layer with an exposed portion of the first gate stack-forming layer disposed in divots.
Figure 2:
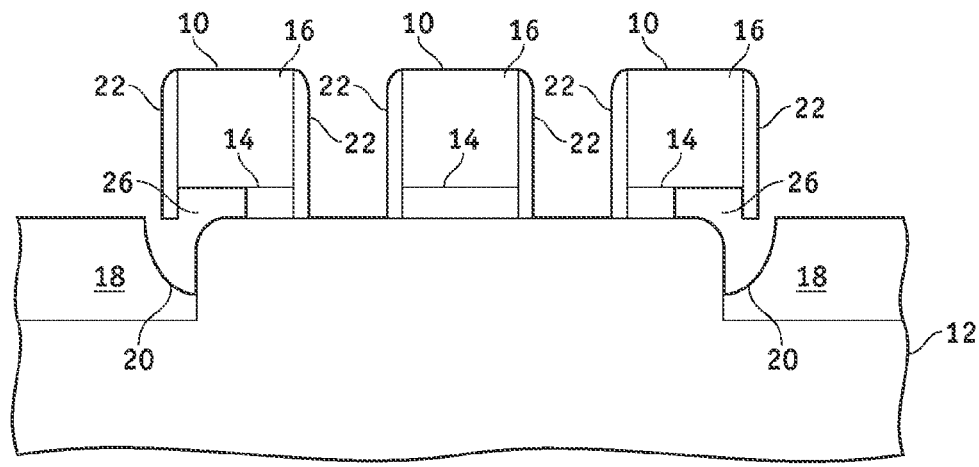
FIG. 2 is a schematic, cross-sectional view of the gate stacks of FIG. 1 with voids underlying the second gate stack-forming layer.
Figure 3:
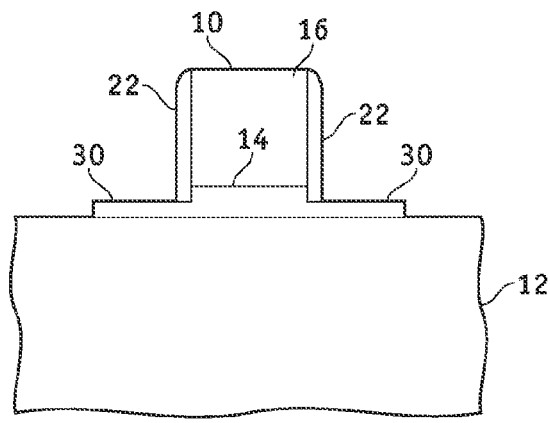
FIG. 3 is a schematic, cross-sectional view of a conventional gate stack comprising a first gate stack-forming layer formed with footers and an overlying second gate stack-forming layer.
Figure 4:
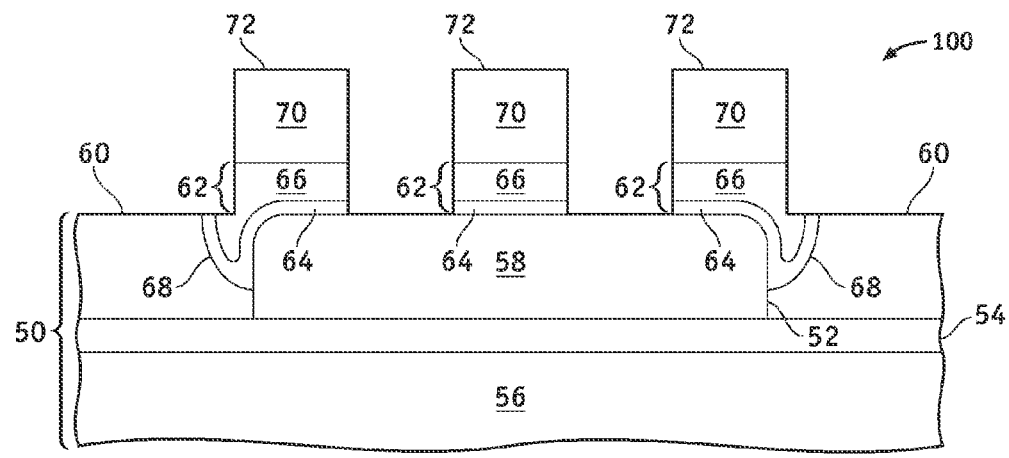
FIGS. 4-9 are schematic, cross-sectional views of methods for forming semiconductor devices, which methods protect gate stacks during subsequent wet etch processing in accordance with an exemplary embodiment of the present invention.

Referring to FIG. 4, in accordance with one exemplary embodiment, the method includes the step of providing a semiconductor substrate 50. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may be a thin layer 52 of silicon on an insulating layer 54 (commonly know as silicon-on-insulator or SOI) that, in turn, is supported by a carrier wafer 56. At least a portion 58 of the silicon substrate is impurity doped, for example by forming N-type well regions and/or P-type well regions for the fabrication of P-channel MOS transistors and N-channel MOS, respectively. The semiconductor substrate 50 may comprise shallow trench isolation (STI) regions 60 used to electrically isolate regions of the semiconductor substrate.

A first gate stack-forming layer 62 is deposited overlying the semiconductor substrate 50. As mentioned above, during fabrication of STI regions 60, divots 68 may form at the interfaces of the STI regions 60 and the semiconductor substrate 50. In this regard, during deposition, the first gate stack-forming layer 62 is deposited, not only overlying the semiconductor substrate 50, but also within the divots 68.

The first gate stack-forming layer 62 may comprise a gate insulator material 64, a metal gate-forming material 66, or, as illustrated, a layered combination thereof. The gate insulator material 64 can be a layer of thermally grown silicon dioxide or, alternatively, a deposited insulator such as a silicon oxide, silicon nitride, or the like. Preferably, the gate insulator material 64 is formed of a deposited high dielectric constant insulator ("high-k dielectric"). As used herein, the terms "high dielectric constant insulator" and "high-k dielectric" refer to insulating materials having a dielectric constant greater than silicon dioxide. Examples of suitable high-k dielectrics include hafnium silicate (HfSiO), hafnium dioxide ($HfO_2$), hafnium silicon oxynitride (HfSiON), zinc dioxide ($ZnO_2$), zirconium oxide ($ZrO_2$), and the like, and combinations thereof. Deposited insulators can be deposited, for example, by chemical vapor deposition (CVD), low pressure chemical vapor deposition (LPCVD), plasma-enhanced chemical vapor deposition (PECVD), physical vapor deposition (PVD), or atomic layer deposition (ALD). Gate insulator material 64 preferably has a thickness of about 1-10 nm, although the actual thickness can be determined based on the application of the transistor in the circuit being implemented.

The metal gate-forming material 66 may be formed of lanthanum (La) or lanthanum alloys, aluminum (Al) or aluminum alloys, magnesium (Mg) or magnesium alloys, titanium-based materials such as titanium nitride (TiN) or titanium aluminum nitride (TiAlN), tantalum-based materials such as tantalum nitride (TaN), tantalum aluminum nitride (TaAlN), or tantalum carbide ($Ta_2C$), or the like. Metal gate-forming material 66 preferably has a thickness of from about 0.05 to about 2 nm, although the actual thickness can vary depending on the application of the transistor in the circuit being implemented.

A second gate stack-forming layer 70 is deposited overlying the first gate stack-forming layer 62. Second gate stack-forming layer 70, having a composition different from that of the first gate stack-forming layer, may comprise electrically conductive gate electrode-forming materials such as metals and metal silicides or, preferably, comprises polycrystalline or amorphous silicon. The second gate stack-forming layer will hereinafter be referred to as polycrystalline silicon, although those of skill in the art will recognize that other materials can also be employed. Second gate stack-forming layer 70 may be formed by itself or with appropriate impurity doping that can set the necessary threshold voltage of the transistor. If the second gate stack-forming layer is polycrystalline or amorphous silicon, that material is typically deposited to a thickness of about 50-200 nm and preferably to a thickness of about 100 nm. The layer of polycrystalline or amorphous silicon can be deposited as silicon that is doped in-situ or can be deposited as undoped silicon and subsequently impurity doped by ion implantation.

In accordance with one embodiment of the invention, a layer of hard mask material (not shown) is deposited onto the polycrystalline silicon to aid in the subsequent patterning and etching of the first and second gate stack-forming layer. The hard mask material can be, for example, a layer of silicon nitride having a thickness of about 10-20 nm. The silicon nitride can be deposited, for example, by LPCVD by the reaction of dichlorosilane and ammonia. The first and second gate stack-forming layers then are photolithographically patterned and etched to form gate stacks 72 overlying semiconductor substrate 50.

Figure 5:
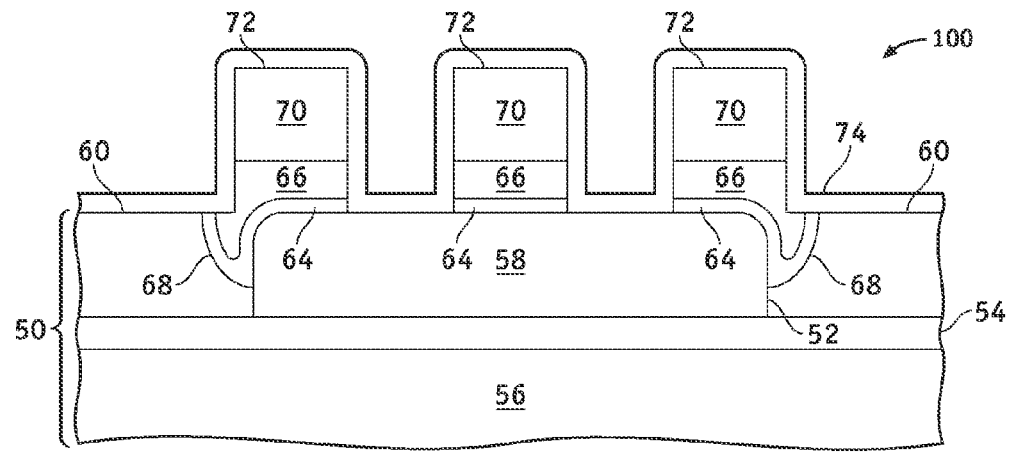
Figure 6:
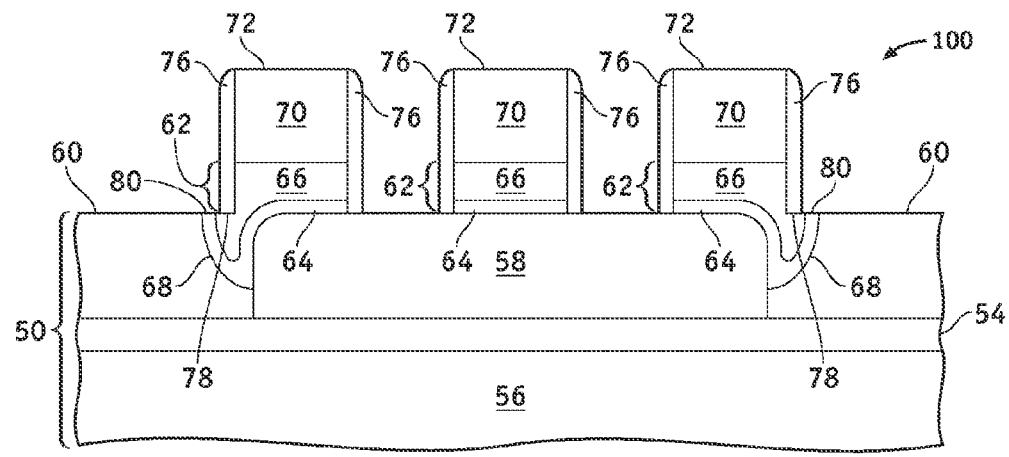

The method continues, in accordance with an exemplary embodiment of the present invention, with the deposition of a first spacer material 74 overlying semiconductor substrate 50 and gate stacks 72, as illustrated in FIG. 5. The first spacer material 74 comprises a material that does not adversely react with the gate insulator material 64 and/or the metal gate-forming material 66. Preferably, the first spacer material 74 comprises silicon nitride. Referring to FIG. 6, first sidewall spacers 76 then can be formed in conventional manner by the anisotropic etching of first spacer material 74. The anisotropic etching can be done, for example, by reactive ion etching (RIE). The RIE process chemistry used depends on the material selected for first sidewall material 74 and may be based on, for example, $CHF_3$, $CF_4$ or $SF_6$, for silicon nitride. As illustrated in FIG. 6, first sidewall spacers 76 cover a first portion 78 of first gate stack-forming layer 62 in divots 68, leaving a second portion 80 exposed, that is, second portion 80 does not underlie the gate stacks or first sidewall spacers 76. In one exemplary embodiment, the first spacer material 74 is deposited to a thickness such that, upon anisotropic etching, first sidewall spacers 76 have a thickness in the range of about 2 nm to about 9 nm.

Figure 7:
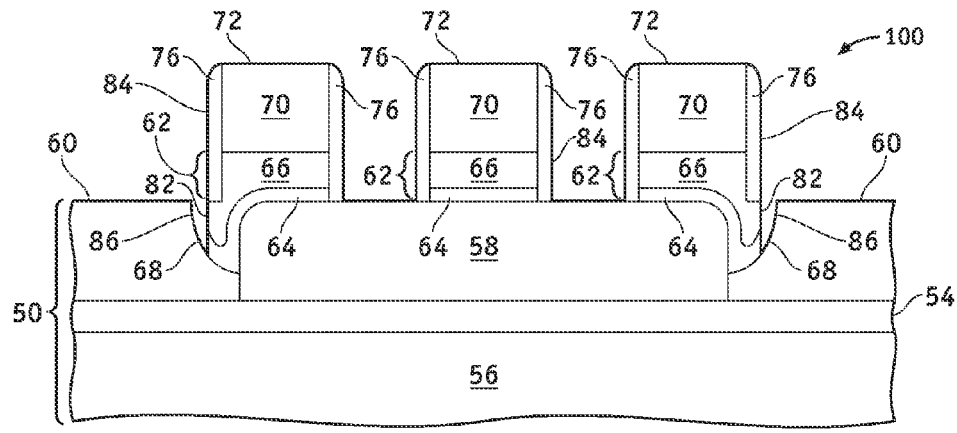

Referring to FIG. 7, after formation of first sidewall spacers 76, the gate stacks 72 and first sidewall spacers 76 are used as an etch mask during the etching of exposed second portions 80 of first gate stack-forming layer 62. In a preferred embodiment, the exposed second portions 80 of first gate stack-forming layer 62 are etched using an anisotropic dry etch, such as RIE, or a controlled wet etch using, for example, ammonium peroxide, sulfur peroxide, or hydrofluoric acid. Preferably, the etch is performed by RIE using $Cl_2$ and $BCl_3$ chemistries. The first gate stack-forming layer 62 is etched to substantially expose a surface 86 of the STI region 60 of the divots 68. If any first gate stack-forming layer 62 remains in divot 68, an exposed surface 82 of the first gate stack-forming layer 62 is self-aligned to a surface 84 of first sidewall spacers 76.

Figure 8:
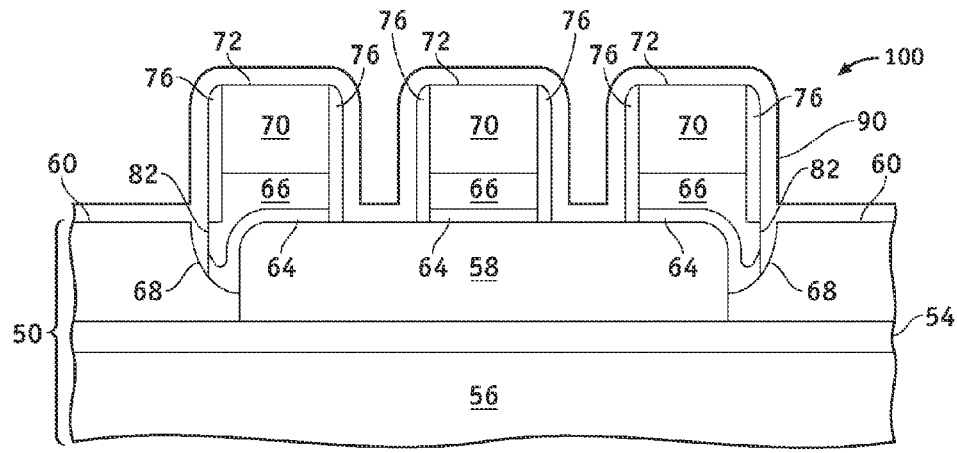
Figure 9:
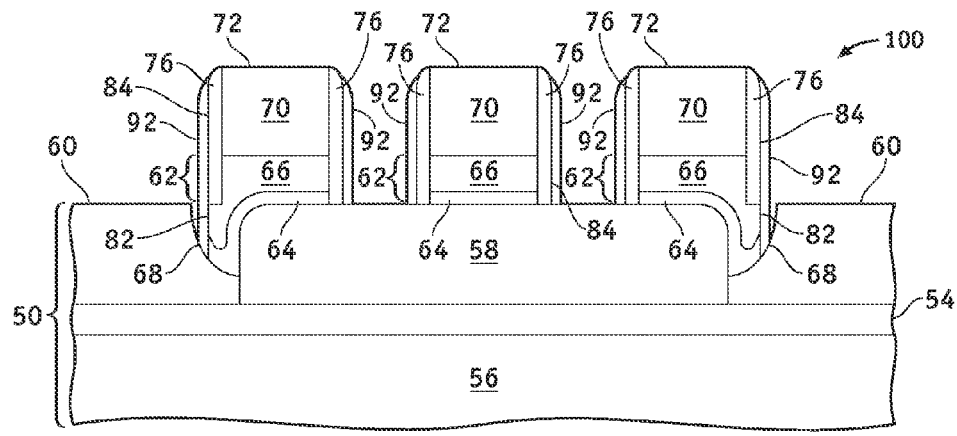

A second spacer material 90 is blanket deposited overlying semiconductor substrate 50, gate stacks 72, and first sidewall spacers 76, as illustrated in FIG. 8. The second spacer material 90 comprises a material that does not adversely react with the gate insulator material 64 and/or the metal gate-forming material 66. In one exemplary embodiment, the second spacer material 90 is of the same composition as the first spacer material 74. Preferably, the second spacer material 90 comprises silicon nitride. Referring to FIG. 9, second sidewall spacers 92 then can be formed in a conventional manner by the anisotropic etching of second spacer material 90. The anisotropic etching can be done, for example, by RIE. In one exemplary embodiment, the combined thickness of a first sidewall spacer 76 and a second sidewall spacer 92 is substantially equal to the thickness of a conventional sidewall spacer typically formed to protect gate stacks. In this regard, the sidewall spacers 76 and 92 consume approximately no more real estate of the semiconductor substrate 50 than such conventional sidewall spacers. In another exemplary embodiment, the second spacer material 90 is deposited to a thickness such that, upon anisotropic etching, second sidewall spacers 92 are formed having a thickness in the range of about 2 nm to about 9 nm. As illustrated in FIG. 9, second sidewall spacers 92 are disposed adjacent surfaces 84 of first sidewall spacers 76 and surfaces 82 of first gate stack-forming material 62. Accordingly, semiconductor device 100 is fabricated with first gate stack-forming layer 62 of gate stacks 72 substantially completely encapsulated by second gate stack-forming layer 70, first sidewall spacers 76, second sidewall spacer 92, STI region 60, and/or semiconductor substrate 50. In this regard, first gate stack-forming layer 62 is protected from any wet etch chemistries used in subsequent processing. In addition to protection of gate stacks 72, first sidewall spacers 76, alone or in combination with second sidewall spacers 92, can be used as ion implantation masks for the formation of source and drain halos, extensions, and/or regions.

Figure 10:
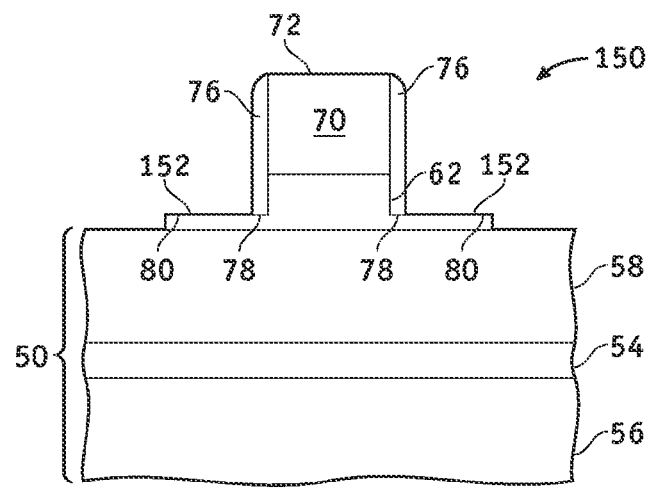
FIGS. 10-12 are schematic, cross-sectional views of methods for forming a semiconductor device, which methods protect a gate stack during subsequent wet etch processing in accordance with another exemplary embodiment of the present invention.
Figure 11:
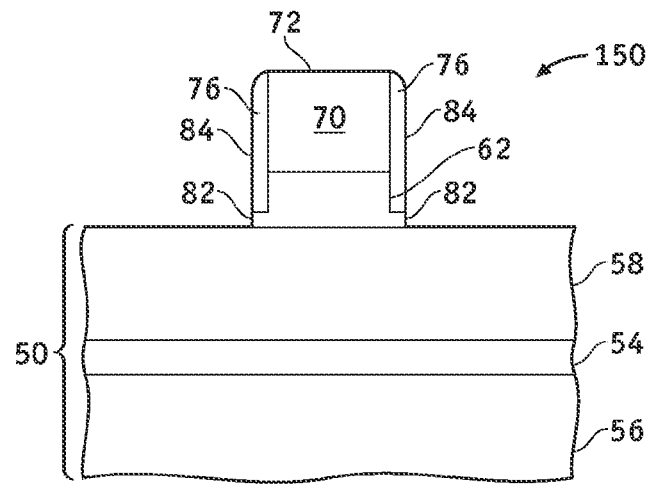
Figure 12:
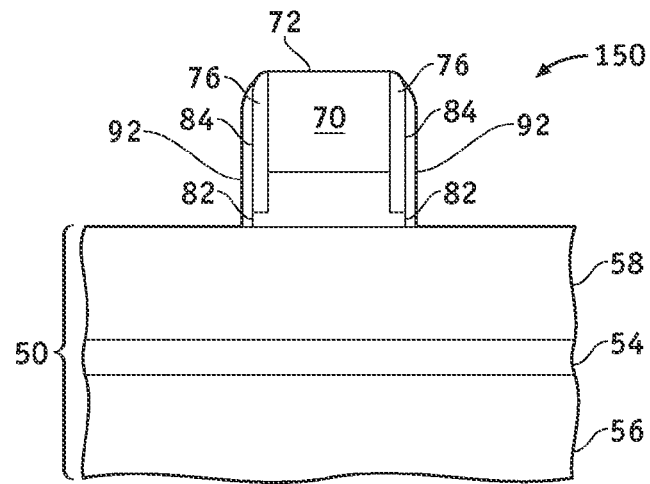

FIGS. 10-12 illustrate, in cross section, exemplary embodiments of the above-described method as used to fabricate a semiconductor device 150 having gate stacks formed with at least one "footing". Semiconductor device 150 is similar to semiconductor device 100, although for simplicity only one gate stack 72 is illustrated, and, accordingly, elements of FIGS. 10-12 that have the same reference numbers as elements of FIGS. 4-9 are the same elements of FIGS. 4-9 and may be formed of the same materials and by the same processes as described above with respect to FIGS. 4-9. As described above, footings can result from the non-uniformity of RIE processes, the non-uniformity of photolithography processes used to form gate stacks, and the like. A similar phenomenon also can result when gate stack-forming material is deposited in scratches that are formed during polishing of the semiconductor substrate. FIG. 10 illustrates, in cross section, semiconductor device 150 having a gate stack 72 disposed overlying silicon substrate 50. Silicon substrate 50, as described above, can be a bulk substrate or, as illustrated, can comprise a carrier wafer 56, a thin silicon layer 52, and an insulating layer 54 interposed therebetween. The gate stack 72 comprises first gate stack-forming layer 62 and second gate stack-forming layer 70. Gate stack 72 is formed with footings 152 of first gate stack-forming layer 62. The footings extend along semiconductor substrate 50 beyond gate stack 72 and, thus, are exposed, that is, they do not underlie the gate stack 72.

In accordance with an exemplary embodiment of the present invention, first sidewall spacers 76 are formed adjacent gate stack 72. First sidewall spacers 76 can be formed by the same processes and using the same materials as described above for first spacers 76 of FIGS. 5-9. As illustrated in FIG. 10, first sidewall spacers 76 cover a first portion 78 of the footing of first gate stack-forming layer 62, leaving a second portion 80 of the footing exposed. In one exemplary embodiment, first sidewall spacers 76 are formed having a thickness in the range of about 2 nm to about 9 nm.

Referring to FIG. 11, after formation of first sidewall spacers 76, the gate stack 72 and first sidewall spacers 76 are used as an etch mask during the etching of exposed second portions 80 of first gate stack-forming layer 62. In a preferred embodiment, the exposed second portions 80 of first gate stack-forming layer 62 are etched using an anisotropic etch, such as RIE. The exposed second portions are etched such that an exposed surface 82 of first gate stack-forming layer 62 is formed in self-alignment with a surface 84 of first sidewall spacers 76.

Referring to FIG. 12, second sidewall spacers 92 then are formed adjacent sidewalls 84 of first sidewall spacers 76 and adjacent exposed surfaces 82 of first gate stack-forming layer 62. Second sidewall spacers 92 can be formed using the same processes and the same materials as described above for forming second sidewall spacers 92 of FIGS. 8 and 9. In one exemplary embodiment, the combined thickness of first sidewall spacers 76 and second sidewall spacers 92 is substantially equal to conventional sidewall spacers typically formed to protect gate stacks. In another exemplary embodiment, the second sidewall spacers 92 are formed having a thickness in the range of about 2 nm to about 9 nm. As illustrated in FIG. 12, second sidewall spacers 92 are disposed adjacent surface 84 of first sidewall spacers 76 and exposed surfaces 82 of first gate stack-forming layer 62. Accordingly, semiconductor device 150 comprises a substantially fully protected gate stack 72, as first gate stack-forming layer 62 is substantially completely encapsulated by second gate stack-forming layer 70, first sidewall spacers 76, second sidewall spacer 92, and/or semiconductor substrate 50. In this regard, first gate stack-forming layer 62 is protected from any wet etch chemistries used in subsequent processing.

Accordingly, methods are provided for the protection of gate stacks of MOS transistors, particularly gate stacks comprising high-k dielectrics and/or metal gate-forming material, during subsequent wet etch processing used to form semiconductor devices. Semiconductor devices formed of such methods also are provided. The various embodiments utilize two spacers that, when combined, consume no more real estate than conventional spacers used to protect the gate stacks but, unlike conventional sidewall spacers, facilitate substantially complete encapsulation of the gate stacks from subsequent wet etch chemistries. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor transistor device comprising:
   a semiconductor substrate;
   a gate stack overlying the semiconductor substrate, wherein the gate stack comprises a first gate stack-forming layer and a second gate stack-forming layer;
   a first sidewall spacer contacting the second gate stack-forming layer; and
   a second sidewall spacer contacting the first sidewall spacer and the first gate stack-forming layer, wherein:
      a portion of the first gate-stack forming layer underlies the first sidewall spacer;
      a first surface of the portion of the first gate-stack forming layer is aligned with a second surface of the first sidewall spacer;
      the second sidewall spacer contacts the first surface and the second surface; and
      the semiconductor substrate includes an isolation region in contact with the second sidewall spacer.

2. The semiconductor transistor device of claim 1, wherein the first surface of the first gate stack-forming layer is formed in self-alignment with the second surface of the first sidewall spacer.

3. The semiconductor transistor device of claim 1, wherein the first sidewall spacer is disposed between the second sidewall spacer and the second gate stack-forming layer.

4. The semiconductor transistor device of claim 1, wherein the first gate stack-forming layer comprises:
   a gate insulator material overlying the semiconductor substrate; and
   a metal gate-forming material overlying the gate insulator material.

5. The semiconductor transistor device of claim 4, wherein the gate insulator material comprises a high dielectric constant insulator.

6. The semiconductor transistor device of claim 5, wherein the high dielectric constant insulator comprises a material selected from the group consisting of hafnium silicate, hafnium dioxide, hafnium silicon oxynitride, zinc dioxide, and zirconium oxide.

7. The semiconductor transistor device of claim 4, wherein the metal gate-forming material includes a material selected from the group consisting of lanthanum, aluminum, magnesium, titanium nitride, titanium aluminum nitride, tantalum nitride, tantalum aluminum nitride, tantalum carbide, lanthanum alloys, aluminum alloys, magnesium alloys, titanium-based materials, and tantalum-based materials.

8. The semiconductor transistor device of claim 1, wherein the first sidewall spacer and the second sidewall spacer each has a thickness in the range of about 2 to about 9 nm.

9. The semiconductor transistor device of claim 1, wherein the second gate stack-forming layer overlies the first gate stack-forming layer.

10. The semiconductor transistor device of claim 9, wherein the first sidewall spacer is disposed between the second gate-stack forming layer and the second sidewall spacer.

11. A semiconductor transistor device comprising:
   a semiconductor substrate;
   a gate stack overlying the semiconductor substrate, wherein the gate stack comprises a first gate stack-forming layer and a second gate stack-forming layer;
   a first sidewall spacer contacting the second gate stack-forming layer; and
   a second sidewall spacer contacting the first sidewall spacer and the first gate stack-forming layer, wherein the semiconductor substrate includes an isolation region in contact with the second sidewall spacer.

12. The semiconductor transistor device of claim 11, wherein a portion of the first gate stack-forming layer contacting the second sidewall spacer is disposed between the isolation region and the first sidewall spacer.

13. A semiconductor device comprising:
   a portion of a semiconductor substrate;
   a gate stack overlying the portion of the semiconductor substrate, wherein the gate stack comprises a first gate stack-forming layer and a second gate stack-forming layer overlying the first gate stack-forming layer;
   a first sidewall spacer contacting the second gate stack-forming layer, wherein a first surface of the first gate stack-forming layer is self-aligned with a second surface of the first sidewall spacer;
   a second sidewall spacer contacting the first sidewall spacer and the first gate stack-forming layer, wherein the second sidewall spacer is in contact with the first surface of the first gate stack-forming layer and the second surface of the first sidewall spacer; and
   an isolation region adjacent to the portion of the semiconductor substrate, wherein:
      a portion of the first gate stack-forming layer is disposed between a portion of the first sidewall spacer and the isolation region; and
      the first gate stack-forming layer comprises:
         a gate insulator material overlying the portion of the semiconductor substrate and in contact with the isolation region and the second sidewall spacer; and
         a metal gate-forming material overlying the gate insulator material and in contact with the second sidewall spacer.

14. A semiconductor device comprising:
   a semiconductor substrate;
   a gate insulator material overlying the semiconductor substrate;
   a metal gate-forming material overlying the gate insulator material;
   a gate stack-forming layer overlying the metal gate-forming material, the gate stack-forming layer comprising polycrystalline or amorphous silicon;
   a first sidewall spacer contacting the gate stack-forming layer; and
   a second sidewall spacer contacting the first sidewall spacer, the gate insulator material, and the metal gate-forming material, wherein:
      the first sidewall spacer is disposed between the second sidewall spacer and the gate stack-forming layer;
      a portion of the gate insulator material contacting the second sidewall spacer is disposed between the first sidewall spacer and the semiconductor substrate; and
      the second sidewall spacer contacts the semiconductor substrate.

15. The semiconductor device of claim 14, wherein the metal gate-forming material is encapsulated by the second sidewall spacer, the gate insulator material, the gate stack-forming layer, and the first sidewall spacer.

16. The semiconductor device of claim 14, wherein the gate insulator material is encapsulated by the second sidewall spacer, the metal gate-forming material, and the semiconductor substrate.

* * * * *